(12) United States Patent
Ramakrishna et al.

(10) Patent No.: US 7,795,078 B2
(45) Date of Patent: Sep. 14, 2010

(54) LEADFRAME PACKAGE FOR MEMS MICROPHONE ASSEMBLY

(75) Inventors: Kambhampati Ramakrishna, Chandler, AZ (US); Seng Guan Chow, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/474,131

(22) Filed: May 28, 2009

(65) Prior Publication Data

US 2009/0263937 A1  Oct. 22, 2009

Related U.S. Application Data

(62) Division of application No. 11/619,563, filed on Jan. 3, 2007, now Pat. No. 7,550,828.

(51) Int. Cl.
*H01L 21/60* (2006.01)
(52) U.S. Cl. ............... 438/123; 257/676; 257/E21.506; 257/E23.145; 257/E31.117; 257/666
(58) Field of Classification Search ......... 257/666–677, 257/E23.031–E23.059, 100, 433, 434, 667, 257/787–796, E31.117–E31.118, E51.02, 257/E23.116–E23.14
See application file for complete search history.

(56) References Cited

U.S. PATENT DOCUMENTS

| | | | |
|---|---|---|---|
| 4,942,452 A | 7/1990 | Kitano et al. |
| 5,331,205 A | 7/1994 | Primeaux |
| 5,684,332 A | 11/1997 | Chen et al. |
| 6,031,281 A | 2/2000 | Kang et al. |
| 6,083,775 A | 7/2000 | Huang et al. |
| 6,339,254 B1 | 1/2002 | Venkateshwaran et al. |
| 6,472,762 B1 | 10/2002 | Kutlu |
| 6,558,978 B1 | 5/2003 | McCormick |
| 6,617,201 B2 | 9/2003 | Chye et al. |
| 6,742,561 B2 | 6/2004 | Nam et al. |
| 6,768,190 B2 | 7/2004 | Yang et al. |
| 6,774,478 B2 | 8/2004 | Eto et al. |
| 6,838,761 B2 | 1/2005 | Karnezos |
| 6,861,288 B2 | 3/2005 | Shim et al. |
| 6,940,169 B2 | 9/2005 | Jin et al. |
| 6,943,057 B1 | 9/2005 | Shim et al. |
| 6,963,142 B2 | 11/2005 | Bolken |
| 6,969,640 B1 | 11/2005 | Dimaano Jr. et al. |
| 6,995,468 B2 | 2/2006 | Abe et al. |

(Continued)

OTHER PUBLICATIONS

Office action dated Sep. 26, 2008 for U.S. Appl. No. 11/525,493, filed Sep. 22, 2006.

(Continued)

*Primary Examiner*—N Drew Richards
*Assistant Examiner*—Mamadou Dialllo
(74) *Attorney, Agent, or Firm*—Robert D. Atkins

(57) ABSTRACT

A cavity semiconductor package has a pre-molded leadframe construction. The leadframe is formed by molding around a die pad, and plural terminal lands. The leadframe has a hole for an acoustic port, such that the package can be soldered on a back side of a printed circuit board and have air access to a sensor die in the package from a front side of the printed circuit board via the acoustic port. The leadframe may also have a hollow or concave recess that defines an acoustic cavity in conjunction with the sensor die or printed circuit board.

19 Claims, 11 Drawing Sheets

U.S. PATENT DOCUMENTS

| | | |
|---|---|---|
| 7,005,325 B2 | 2/2006 | Chow et al. |
| 7,042,098 B2 | 5/2006 | Harun et al. |
| 7,064,430 B2 | 6/2006 | Chow et al. |
| 2004/0036164 A1 | 2/2004 | Koike et al. |
| 2004/0113253 A1 | 6/2004 | Karnezos |
| 2004/0229399 A1 | 11/2004 | Chen et al. |
| 2004/0262039 A1 | 12/2004 | Taggart et al. |
| 2005/0012195 A1 | 1/2005 | Go et al. |
| 2005/0090050 A1 | 4/2005 | Shim et al. |
| 2006/0110849 A1 | 5/2006 | Lee et al. |
| 2007/0013052 A1 | 1/2007 | Zhe et al. |

OTHER PUBLICATIONS

Office action dated Aug. 1, 2008 for U.S. Appl. No. 11/532,387, filed Sep. 15, 2006.

Office action dated Jan. 16, 2009 for U.S. Appl. No. 11/532,387, filed Sep. 15, 2006.

Office action dated Aug. 5, 2008 for U.S. Appl. No. 11/601,103, filed Nov. 17, 2006.

Office action dated Jun. 9, 2008 for U.S. Appl. No. 11/608,164, filed Dec. 7, 2006.

Office action dated Dec. 23, 2008 for U.S. Appl. No. 11/608,164, filed Dec. 7, 2006.

"BCC Bump Chip Carrier," STATSChipPAC Ltd., 2 pages (May 2006).

"Data Sheet—Package Stackable Very Thin Fine Pitch BGA (PSvfBGA)," Amkor Technology, 2 pages (Apr. 2006).

"Data Sheet—Stacked CSP (S-CSP)," Amkor Technology, 2 pages (Jul. 2005).

"Redistributed Chip Package (RCP) Technology," Freescale Semiconductor (2005).

"Solder Bump Flip Chip," Tutorial 2—Nov. 2000, http://www.flipchips.com/tutorial02a.html.

"Trends in Package Development: FCBGA (Flip Chip Ball Grid Array)," NEC Electronics, http://www.necel.com/pkg/en/pk02_03.html.

"Wire Bond and Beyond: Semiconductor Packaging Innovations," Freescale Semiconductor, Inc., Doc. No. WIREBONDBYNDWP, Rev. 0 (Jul. 2006).

Aguirre, "Super High Density Packaging Technologies," Fujitsu Microelectronics America, Inc., 23 pages (Sep. 2002).

Allan, "SiP Really Packs It In," *Electronic Design*, 13 pages (Nov. 29, 2004) [http://www.elecdesign.com/Articles/Print.cfm?ArticleID-9175].

Baliga, "Via Lands Double as Bonding Pads," *Semiconductor International*, pp. 1-3, 2006 http://www.reed.electronics.com/semiconductor/article/CA6329047.html.

FlipChip International, "Bumping Design Guide," Revised Aug. 2005, www.flipchip.com.

Pendse et al., "Bond-on-Lead: A Novel Flip Chip Interconnection Technology for Fine Effective Pitch and High I/O Density," *Electronic Components and Technology Conference*, May 30-Jun. 2, 2006.

Pendse, "Future Directions in Package-level Integration," *APIA Symposium*, Jul. 15, 2004, 18 pages.

Riley, "Introduction to Flip Chip: What, Why, How," posted Oct. 2000, Tutorial 1—Oct. 2000, http://www.flipchips.com/tutorial01.html.

Sturcken et al., "Advanced Packaging, Cover Story: Bare Chip Stacking," *Advanced Packaging Magazine*, 5 pages, Apr. 2003 <http://ap.pennnet.com/Articles/Article_Display.cfm?Section=Archives&Subsection=Display&Article_ID=172233>.

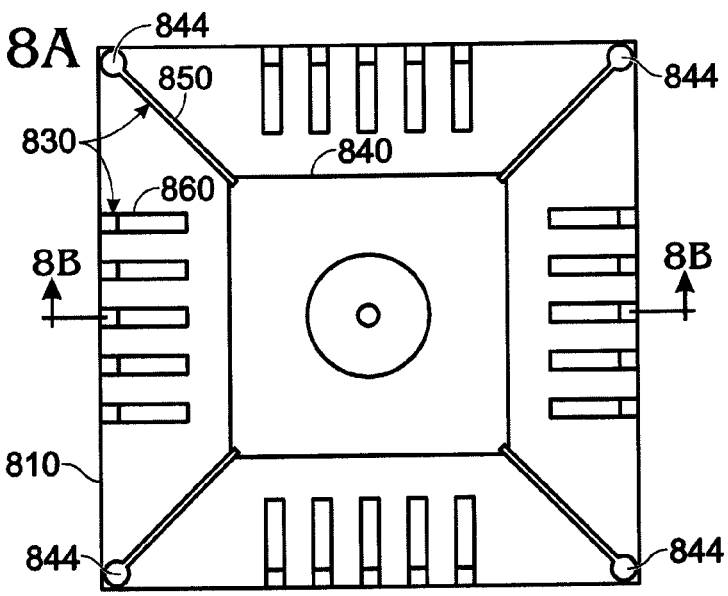
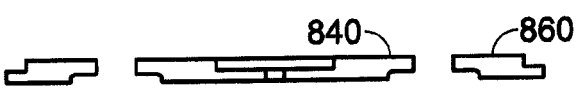
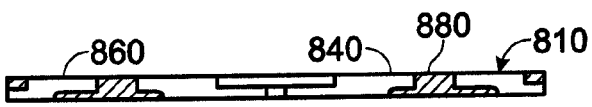
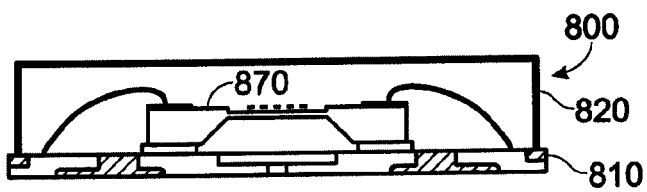
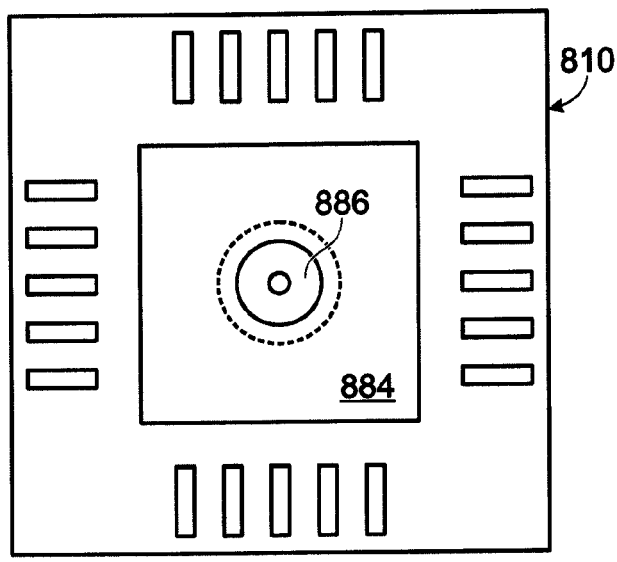

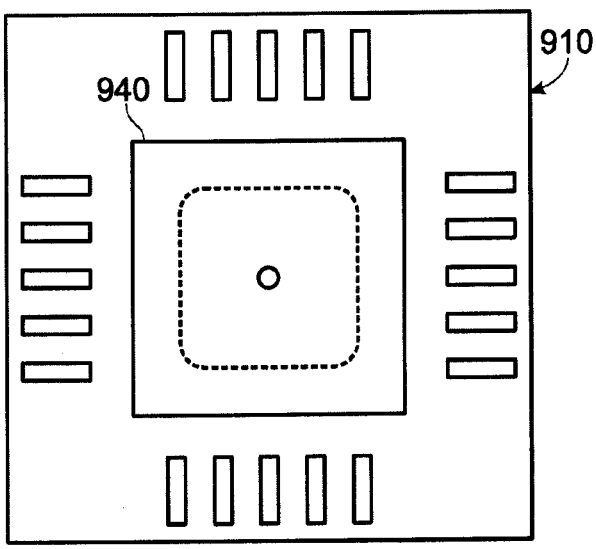
FIG. 9E
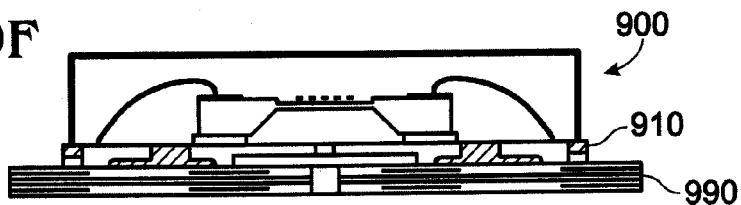
FIG. 9F
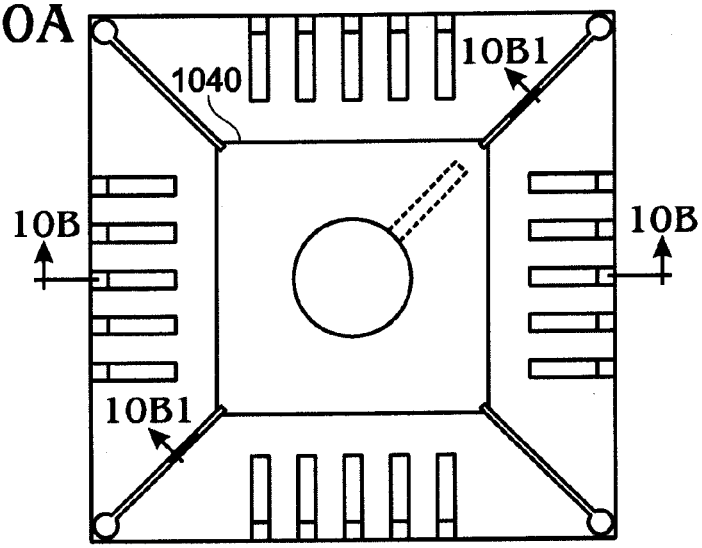
FIG. 10A
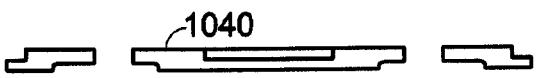
FIG. 10B
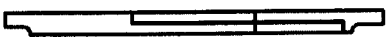
FIG. 10B1

FIG. 11B1

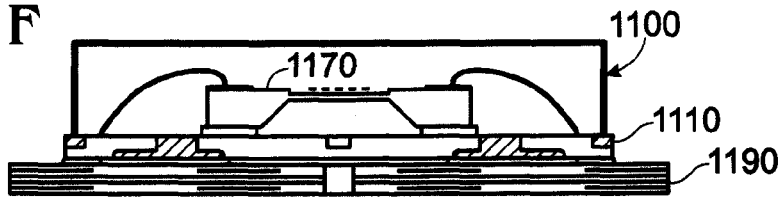
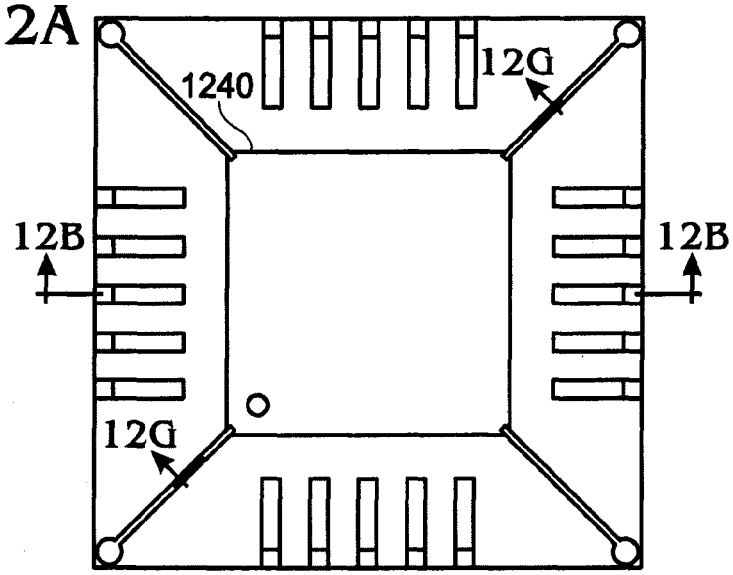
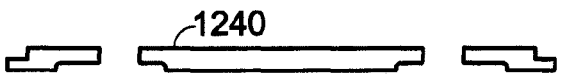
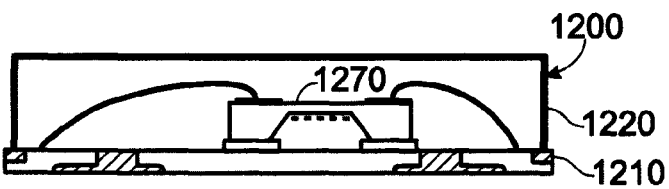

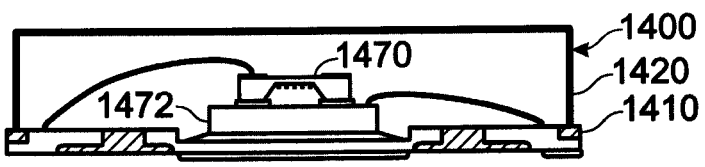
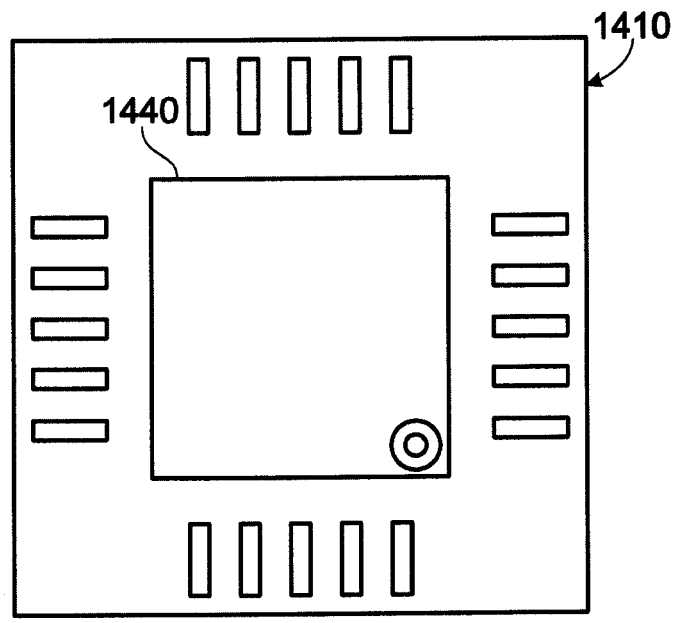
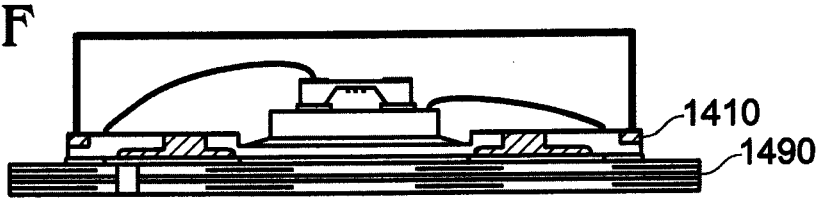
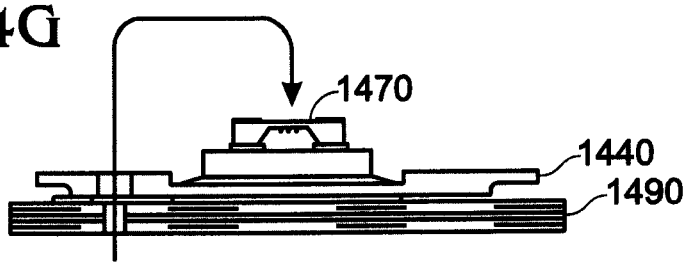

LEADFRAME PACKAGE FOR MEMS MICROPHONE ASSEMBLY

CROSS-REFERENCE TO RELATED APPLICATION

The present application is a divisional of U.S. application Ser. No. 11/619,563, which was filed on Jan. 3, 2007 now U.S. Pat. No. 7,550,828, and is hereby incorporated in its entirety by this reference.

FIELD

The field of the present invention relates generally to semiconductors, and more particularly to packages for semiconductors.

BACKGROUND

Integrated circuit dies are conventionally enclosed in plastic or ceramic packages that provide protection from hostile environments and enable electrical interconnection between the integrated circuit die and an underlying substrate such as a printed circuit board (PCB). The leadframe is the central supporting structure of such a package. A portion of the leadframe is internal to the package, i.e., completely encapsulated in the package.

Certain semiconductor varieties present unique packaging needs, such as cavity semiconductors that require a hole for sound or air access to the die. One example of such cavity semiconductors is the micro-electro-mechanical system (MEMS) microphone, which is commonly found in cell phones and like applications. Other types of semiconductor micro-sensors also may have a similar cavity and hole structure.

A typical MEMS silicon microphone has a design based on capacitance variation from diaphragm movement due to sound waves, as depicted generally in FIGS. 1 and 2. The structure of the illustrated MEMS microphone 100 includes an etched cavity 110, a moving plate or diaphragm 120, and a fixed plate 130. FIG. 1 illustrates a variation of the design (Type A) of the MEMS microphone 100 with the diaphragm on the bottom side of the microphone die. FIG. 2 shows another design variation (Type B) of the MEMS microphone 200 with the diaphragm 120 on the top side of the die. When assembled into a cavity package, the package can have an acoustic port placed either at the package's top side (for the type B design) or on its bottom side (for type A). This preferred placement of the acoustic port allows the sound wave to impinge directly on to the diaphragm rather than having the sound pass through the plate.

Current approaches to packaging cavity semiconductors include using ceramic packages, or plastic packages with laminate substrate, or a pre-molded leadframe in which the lid or base has a hole.

Ceramic packages have been used for MEMS applications in which the integrated circuit die cannot be capped. However, ceramic packages are expensive compared to plastic packages. For this reason, the semiconductor industry wherever possible has moved away from the expensive ceramic packaging.

Another approach for MEMS microphone packaging uses a plastic package 300 with a laminate substrate 310, such as illustrated in FIG. 3. This package encloses the MEMS microphone die 200 along with an application-specific integrated circuit (ASIC) chip 320, both supported on the substrate 310. The package may also contain other discrete components, such as surface-mount technology (SMT) capacitors. The substrate is a laminate printed circuit board (PCB) variety. The package includes a lid 330, which may be a single piece construction or multiple pieces. The lid has an acoustic opening or port 340, and along with the laminate substrate defines an acoustic cavity 350 containing the dies 200, 320.

A laminate substrate similar to that in the package shown in FIG. 3 also is commonly used in BGA (Ball Grid Array) or other array packages. However, laminate substrates also contribute significantly to the expense of the package.

An alternative approach for further reducing cost is to use a pre-molded leadframe. FIG. 4 illustrates one example of a pre-molded leadframe package 400 for a MEMS microphone. The package 400 includes a pre-molded leadframe 410 and a lid 420, which together define an acoustic cavity 450 containing the MEMS microphone die 200. The lid again may be a single piece construction or multiple pieces, and has an acoustic port 440 in the lid. By using a pre-molded leadframe instead of a laminate substrate, the cost of the package is lower compared to a package with laminate substrate.

It is known that size or location of the acoustic port 340, 440 and cavity 350, 450 of the package 300, 400 affect the microphone's performance. Thus, a proper package design that takes into account the configuration of the MEMS microphone chip, the package acoustic port and cavity is critical for performance. In addition, the path from sound source to package port 340, 440 for a particular application preferably is short.

In the case of a cell phone application for example, the MEMS microphone package preferably has its acoustic hole on the bottom side of the package. FIG. 5 illustrates a typical configuration of a cell phone 500 using the pre-molded leadframe package 400. The cell phone handset is configured to have the microphone near the bottom of the keypad, so as to be near the mouth when the handset is held to the user's ear. The case 510, 511 of the cell phone therefore has a hole or holes 530 on its front side 510, next to the keypad (not shown). The electronic components of the cell phone 500 are supported on a printed circuit board (PCB) 540 inside the case 510. As with most thin cell phone designs, the electronic components 550 of the phone are on a back side of the PCB 540, opposite to the keypad. Except, the microphone package 400 is placed on the front side of the PCB 540 to provide a short acoustic path to the microphone die. The microphone's performance is further enhanced with the addition of a gasket 560 between the microphone package 400 and front side 510 of the case. The gasket can be a flat rubber piece with a hole.

The microphone package design in this typical cell phone configuration has some disadvantages. First, the placement of the microphone package on the front side of the PCB increases the cell phone thickness. Further, the gasket between the microphone package 400 and case can potentially cause stress on the microphone package.

For these reasons, a cell phone design 600 shown in FIG. 6 that reflows the microphone package along with the other components 550 onto the back side of the PCB 540 is preferred. For this cell phone design, the microphone package 700 (shown in FIG. 7) is the laminate substrate type, with a hole 730 formed through the laminate substrate 720 on a bottom side of the package 700. The PCB 540 also has a corresponding hole 640. The microphone package also provides an acoustic cavity 750 formed in the laminate substrate 720. This configuration of the microphone package to have a bottom port and acoustic cavity allows designers to reflow the microphone package to the PCB back side and thereby achieve a much thinner cell phone design. However, the design still has disadvantages: (1) the laminate substrate remains more expensive compared to a pre-molded leadframe, and (2) the acoustic cavity inside the laminate substrate increases the thickness of the substrate, and requires more layers of laminate stack-up for the substrate.

SUMMARY

The following Detailed Description presents a cavity semiconductor package using a pre-molded leadframe having an acoustic port through the leadframe. This allows placement of the package on a printed circuit board back side with sound or air access to the sensor die from the printed circuit board front side through the acoustic port. In cell phone and like device applications, such placement is preferred to enable a thinner device case.

In some variations of the cavity semiconductor package described herein, the leadframe includes a concave surface that defines an acoustic cavity in conjunction with the semiconductor die or with the printed circuit board. This surface can be a half-etch recess formed in a die pad of the leadframe. The design of the shape and size of this cavity can be varied according to the application to produce desired acoustic performance, such as to help prevent undesired resonance.

Further, some variations of the cavity semiconductor package can include a plated area surrounding the acoustic port for soldering the package to a printed circuit board. The solder forms a seal around the acoustic port between the package and circuit board, which prevents air leakage from the acoustic port. In addition, the leadframe may have an unplated area about the acoustic port between the acoustic port and the plated area, so as to help avoid obstruction of the acoustic port from solder contamination.

This Summary is provided to introduce a selection of concepts in a simplified form that is further described below in the Detailed Description. This summary is not intended to identify key features or essential features of the claimed subject matter, nor is it intended to be used as an aid in determining the scope of the claimed subject matter. Additional features and advantages of the invention will be made apparent from the following detailed description of embodiments that proceeds with reference to the accompanying drawings.

BRIEF DESCRIPTION OF THE DRAWINGS

FIG. 8A is a top view of a pre-molded leadframe for a cavity semiconductor package, such as for a MEMS microphone.

FIG. 8B is a side view taken along a cross-section 8B-8B of the pre-molded leadframe of FIG. 8A before pre-molding.

FIG. 8C is a side view also taken along the cross-section 8B-8B of the pre-molded leadframe of FIG. 8A after pre-molding.

FIG. 8D is a cross-sectional side view of a MEMS microphone package including the pre-molded leadframe of FIG. 8C after package assembly with lid attached.

FIG. 8E is a bottom view of the pre-molded leadframe package of FIG. 8D.

FIG. 9E is a bottom view of the pre-molded leadframe package of FIG. 9D.

FIG. 9F is a cross-sectional side view of the pre-molded leadframe package of FIG. 9D after assembly with a printed circuit board.

FIG. 10A is a top view of a pre-molded leadframe for a cavity semiconductor package, such as for a MEMS microphone.

FIG. 10B is a side view taken along a cross-section 10B-10B of the pre-molded leadframe of FIG. 10A before pre-molding.

FIG. 10B1 is a side view taken along a cross-section 10B1-10B1 of the die pad of the pre-molded leadframe of FIG. 10A.

FIG. 11B1 is a side view taken along a cross-section 11B1-11B1 of the die pad of the pre-molded leadframe of FIG. 11A.

FIG. 11F is a cross-sectional side view of the pre-molded leadframe package of FIG. 11D after assembly with a printed circuit board.

FIG. 11G is a cross-sectional side view of the die pad of FIG. 11B1 after assembly with the printed circuit board.

FIG. 12A is a top view of a pre-molded leadframe for a cavity semiconductor package, such as for a MEMS microphone.

FIG. 12B is a side view taken along a cross-section 12B-12B of the pre-molded leadframe of FIG. 12A before pre-molding.

FIG. 12C is a side view also taken along the cross-section 12B-12B of the pre-molded leadframe of FIG. 12A after pre-molding.

FIG. 12D is a cross-sectional side view of a MEMS microphone package including the pre-molded leadframe of FIG. 12C after package assembly with lid attached.

FIG. 14D is a cross-sectional side view of a MEMS microphone package including the pre-molded leadframe of FIG. 14C after package assembly with lid attached.

FIG. 14E is a bottom view of the pre-molded leadframe package of FIG. 14D.

FIG. 14F is a cross-sectional side view of the pre-molded leadframe package of FIG. 14D after assembly with a printed circuit board.

FIG. 14G is a side view of the die pad taken along a cross-section 14G-14G of the pre-molded leadframe of FIG. 14A after assembly with the printed circuit board.

DETAILED DESCRIPTION

The following description relates to a leadframe package for cavity semiconductors, and the manufacture thereof. The following description describes an example application of the leadframe package for a MEMS microphone. However, the leadframe package and manufacturing techniques also can be used in other applications, including other micro-sensors and cavity semiconductors.

Figure 8F:
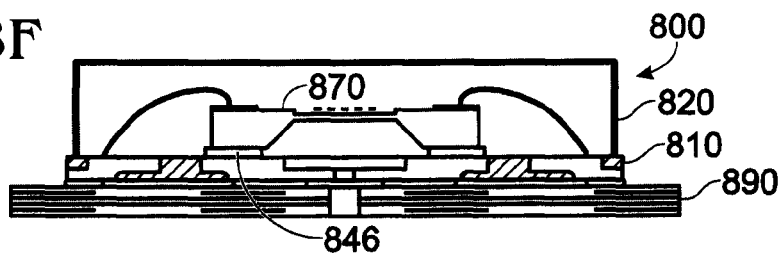
FIG. 8F is a cross-sectional side view of the pre-molded leadframe package of FIG. 8D after assembly with a printed circuit board.
Figure 9A:
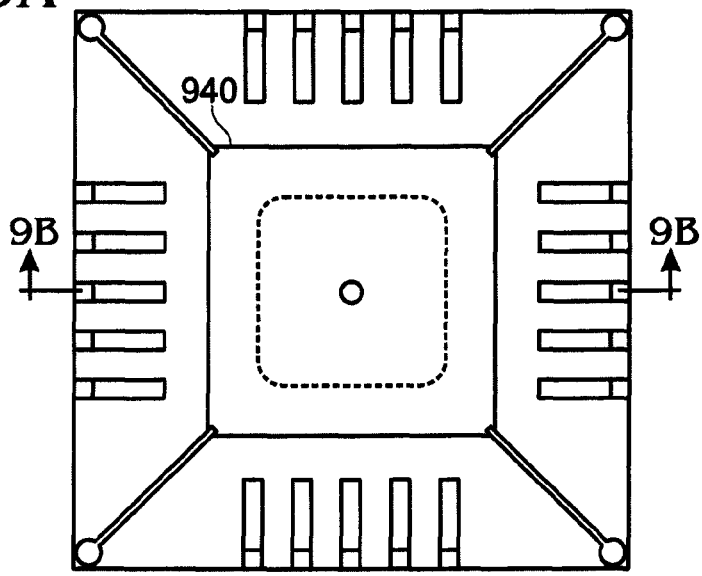
FIG. 9A is a top view of a pre-molded leadframe for a cavity semiconductor package, such as for a MEMS microphone.
Figure 9B:
FIG. 9B is a side view taken along a cross-section 9B-9B of the pre-molded leadframe of FIG. 9A before pre-molding.
Figure 9C:
FIG. 9C is a side view also taken along the cross-section 9B-9B of the pre-molded leadframe of FIG. 9A after pre-molding.
Figure 9D:
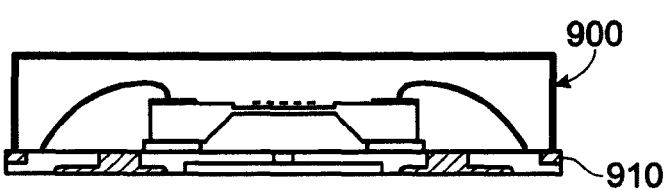
FIG. 9D is a cross-sectional side view of a MEMS microphone package including the pre-molded leadframe of FIG. 9C after package assembly with lid attached.
Figure 10C:
FIG. 10C is a side view also taken along the cross-section 10B-10B of the pre-molded leadframe of FIG. 10A after pre-molding.
Figure 10D:
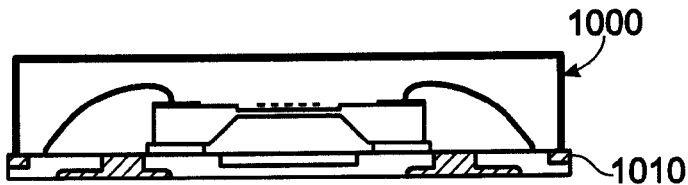
FIG. 10D is a cross-sectional side view of a MEMS microphone package including the pre-molded leadframe of FIG. 10C after package assembly with lid attached.
Figure 10E:
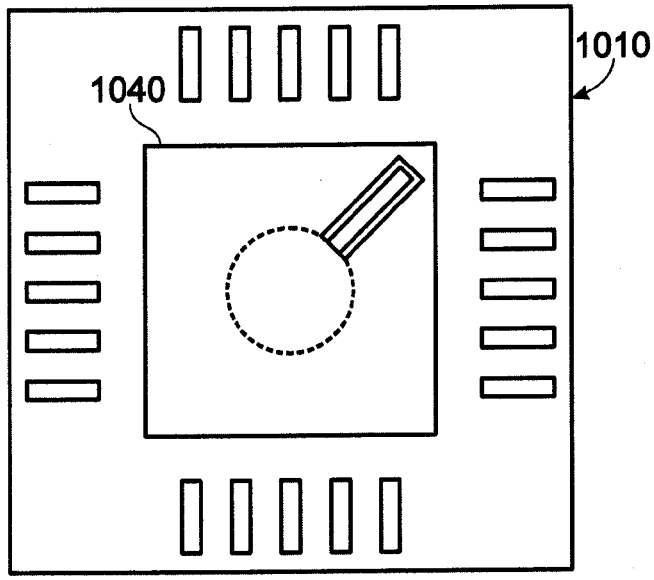
FIG. 10E is a bottom view of the pre-molded leadframe package of FIG. 10D.
Figure 10F:
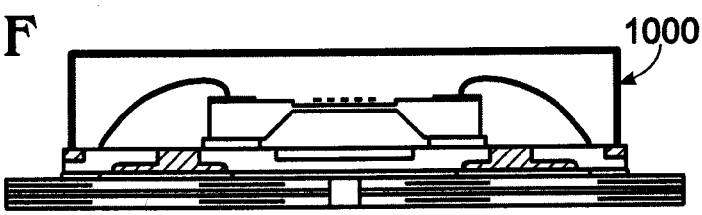
FIG. 10F is a cross-sectional side view of the pre-molded leadframe package of FIG. 10D after assembly with a printed circuit board.
Figure 10G:
FIG. 10G is a cross-sectional side view of the die pad of FIG. 10B1 after assembly with the printed circuit board.
Figure 11A:
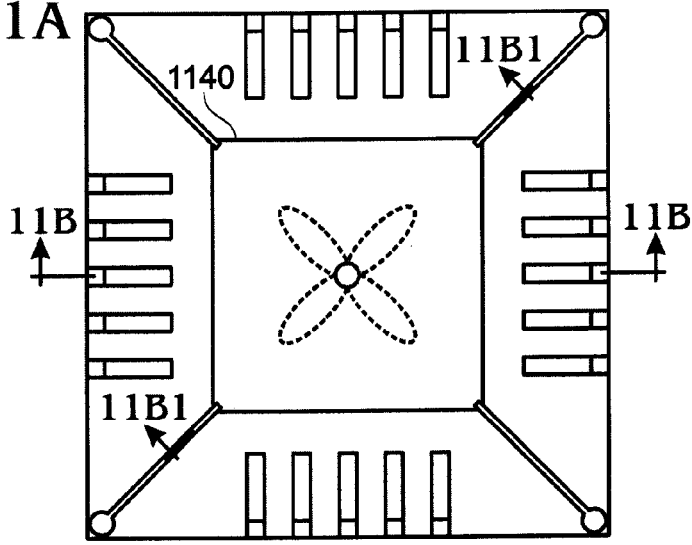
FIG. 11A is a top view of a pre-molded leadframe for a cavity semiconductor package, such as for a MEMS microphone.
Figure 11B:
FIG. 11B is a side view taken along a cross-section 11B-11B of the pre-molded leadframe of FIG. 11A before pre-molding.
Figure 11B:
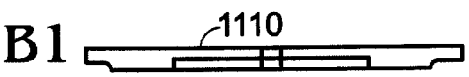
Figure 11C:
FIG. 11C is a side view also taken along the cross-section 11B-11B of the pre-molded leadframe of FIG. 11A after pre-molding.
Figure 11D:
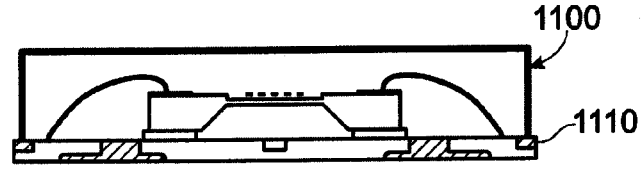
FIG. 11D is a cross-sectional side view of a MEMS microphone package including the pre-molded leadframe of FIG. 11C after package assembly with lid attached.
Figure 11E:
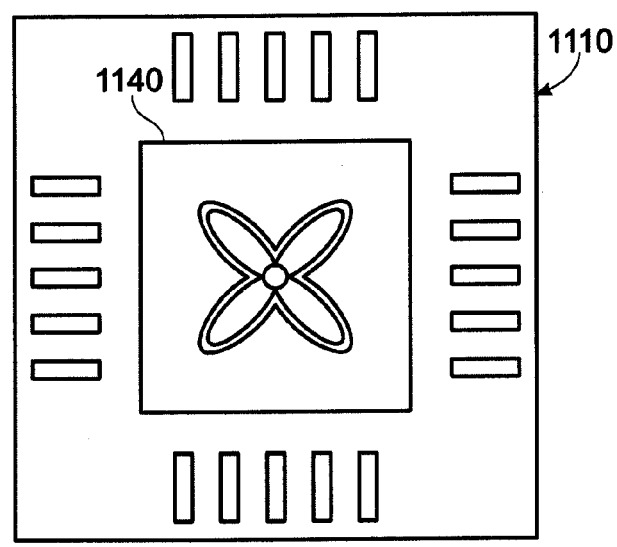
FIG. 11E is a bottom view of the pre-molded leadframe package of FIG. 11D.
Figure 12E:
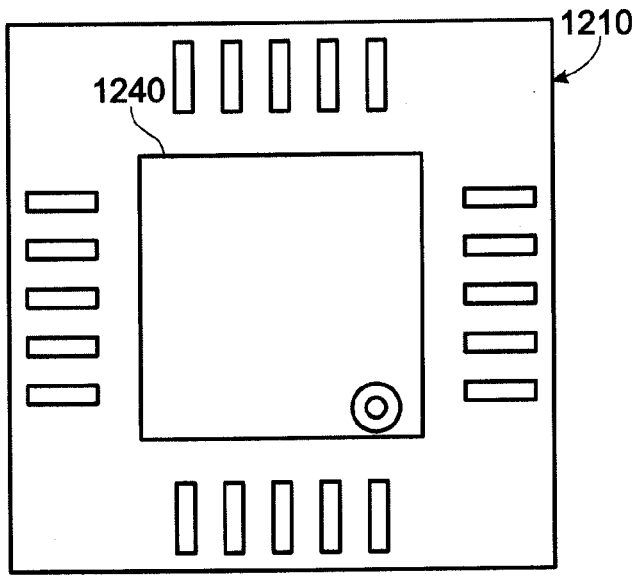
FIG. 12E is a bottom view of the pre-molded leadframe package of FIG. 12D.
Figure 12F:
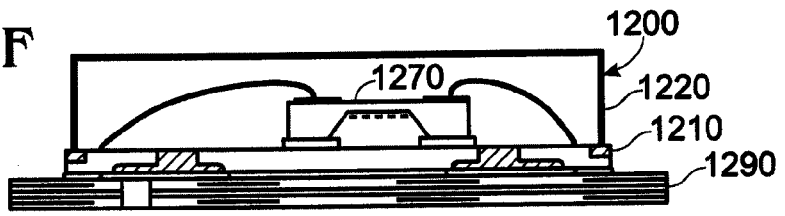
FIG. 12F is a cross-sectional side view of the pre-molded leadframe package of FIG. 12D after assembly with a printed circuit board.
Figure 12G:
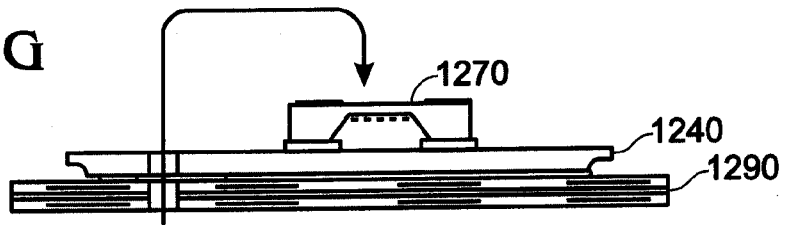
FIG. 12G is a side view of the die pad taken along a cross-section 12G-12G of the pre-molded leadframe of FIG. 12A after assembly with the printed circuit board.

Referring now to FIGS. 8A-8F, a first embodiment of a pre-molded leadframe package 800 for cavity semiconductors is constructed of a pre-molded leadframe 810 and a conductive lid 820. The pre-molded leadframe 810 consists of a die pad 840, a plurality of metal leads 830 and a molding compound 880. The metal leads 830 further consist of a plurality of the terminal lands 860 and a plurality of the tie bars 850. The molding material 880 is formed around the die pad 840 and metal leads 830 and is substantially co-planar to them. The die pad 840 is positioned centrally in the pre-molded leadframe 810. The die pad 840 and the metal leads 830 can have the selective half-etched portions at their edges for locking them securely into the molding material 880, as shown in FIGS. 8B-8C. The die pad 840 is attached to the outer frame (not shown) by a number of bottom half-etched tie bars 850 that connect the corners of the die pad to the corners of the outer frame. Each tie bar 850 is designed to have a grounding pad 844 near the outer frame. When assembled with the lid, the grounding pads 844 on tie bars 850 are in contact with the conductive lid 820, and provide an electrical connection between the conductive lid and die pad for grounding. However, there is an optional case of pre-molded leadframe without tie bar grounding pads. Therefore, a non-conductive adhesive can be used for the lid attachment. The die pad 840 also includes a circular recess 842 for an acoustic cavity, and a bottom hole 848. The recess 842 is formed at half etch depth on a top side of the die pad 840. In this way, the recess 842 defines the acoustic cavity in conjunction with the MEMS microphone die 870 when the die is mounted onto the top of the die pad 840 of the pre-molded leadframe 800 using a die attach adhesive 846.

The leadframe 810 also has a number of terminal lands 860 formed in the outer metal leads 830, and arranged on each of the four sides of the outer frame about the die pad 840. The terminal lands 860 extend through the outer frame, so that a rectangular contact portion of each terminal land 860 is exposed on the top and bottom sides of the leadframe. The exposed contact portions of the terminal lands 860 on the top side extend toward the die pad 840, such that electrical connections to the semiconductor die (e.g., a MEMS microphone die 870 contained in the package) can be formed by attaching lead wires 872 from the terminal lands 860 to terminals 874 on the MEMS microphone die, as illustrated in FIGS. 8D and 8F.

The pre-molded leadframe 810 is constructed by first placing a leadframe strip (not shown), which is typically configured in a matrix form, into their positions as shown in FIG. 8B inside a mold (not shown), then flowing a molding material, such as an epoxy, into the spaces about the terminal lands and die pad to form the outer frame. An injection molding, transfer molding or other molding process can be used. The terminal lands 860, tie bars 850 and die pad 840 are left exposed on top and bottom surfaces of the leadframe. This molding process yields the pre-molded leadframe 810 shown in FIG. 8C. The pre-molded leadframe 810 can be pre-plated with a suitable metal finish layer, such as Ni/Pd/Au, on the bottom surface of terminal lands 860 and the partial die pad area (pre-plated area 884) for mounting on a ground pad on a printed circuit board, as shown in FIG. 8E. Further, some areas on the bottom of the pre-molded leadframe 810 can be left unplated. For example, an unplated area 886 about the bottom hole 848 in the die pad 840 optionally may be left unplated.

After the pre-molding process, the pre-molded leadframe 810, conductive lid 820 and MEMS microphone die 870 (or other cavity semiconductor) are assembled into the package 800. The MEMS microphone die 870 is attached on top of the die pad 840 of the pre-molded leadframe 810. The conductive lid 820 also is attached to the top of the pre-molded leadframe 810, in contact with the grounding pads 844 of the tie bars 850 at the corners of the leadframe, typically using an electrical conductive adhesive. The finished individual package can be formed after each of the assembled packages is singulated from the pre-molded leadframe strip. Later, at assembly of the package on a printed circuit board 890, the package is placed on conductive pads, such as with the plated area of the die pad 840 in contact with a ground pad and the terminal lands in contact with electrical contacts on the printed circuit board. In this way, the MEMS microphone die 870 and conductive lid 820 are effectively grounded via the die pad 840 and tie bars 850 to the printed circuit board ground pad.

In alternative embodiments of the pre-molded leadframe package, the acoustic cavity can be varied in shape and size for improved acoustic performance, such as to prevent resonance. Further, the shape and position of the hole can be varied for acoustic effect or other design considerations. The leadframe package 800 shown in FIGS. 8A-8F has the acoustic cavity formed on the top of the die pad using half etch leadframe technology, such that the acoustic cavity is defined by the die pad 840 in conjunction with the MEMS microphone die 870. The leadframe package 800 has a centrally located, round hole 848.

A pre-molded leadframe package 900, as per an alternative second embodiment shown in FIGS. 9A-9F, has a recess 942 for an acoustic cavity formed on the bottom of the die pad 940 of the pre-molded leadframe 910. This acoustic cavity has the shape of a square with rounded corners. After assembly of the package 900 with a printed circuit board 990, the acoustic cavity is defined by the pre-molded leadframe 910 in conjunction with the printed circuit board 990. The leadframe package 900 also has a centrally located, round hole 948.

A third embodiment of a pre-molded leadframe package 1000 shown in FIGS. 10A-10G has a round recess 1042 for an acoustic cavity formed in the top of the die pad 1040 of the pre-molded leadframe 1010 by half-etch technology, similar to the first embodiment pre-molded leadframe package 800. However, the die pad 1040 also has a rectangular, half-etch groove 1048 in the bottom of the die pad 1040 that extends from the acoustic cavity to allow for off-center alignment of the pre-molded leadframe package 1000 to an acoustic port on the printed circuit board 1090.

A fourth embodiment of a pre-molded leadframe package 1100 shown in FIGS. 11A-11G has a central half-etch hole on top of a die pad 1140 of a pre-molded leadframe 1110, and an arrangement of oval-shaped, half-etch recesses 1142 for acoustic cavity sections on the bottom of the die pad extending in a flower petal configuration from the central hole toward the die pad corners. When the package 1100 is assembled on a printed circuit board 1190, one of the acoustic cavity sections aligns with the acoustic port in the printed circuit board 1190.

A fifth embodiment of a pre-molded leadframe package 1200 shown in FIGS. 12A-12G has a hole 1248 in a die pad 1240 of a pre-molded leadframe 1210 that is off-set to a corner of the die pad. The MEMS microphone die 1270 in this case is not placed over the hole, and does not define the acoustic cavity in conjunction with the die pad. The die pad 1240 also does not include any half-etch recess for the acoustic cavity. Instead, the acoustic cavity in this leadframe package 1200 is defined by the leadframe 1210 in conjunction with the conductive lid 1220. This permits use of a top-side diaphragm type MEMS microphone die 1270, similar to the type B MEMS microphone die 200 shown in FIG. 2.

Figure 13A:
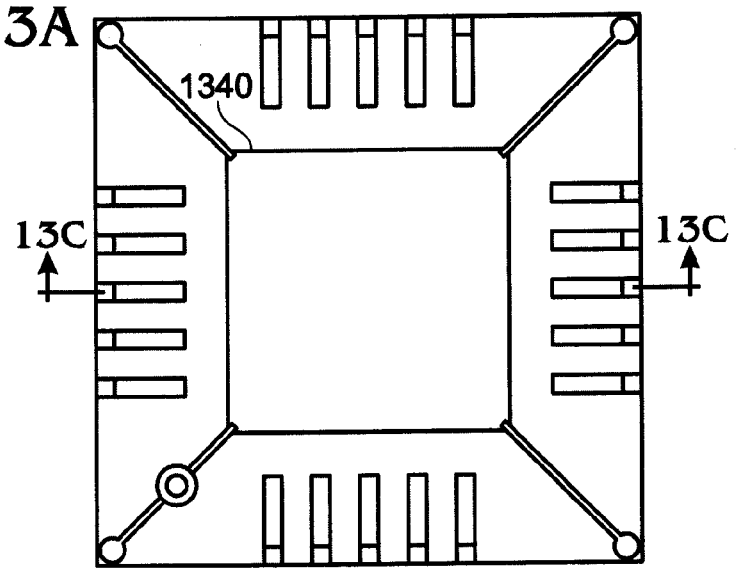
FIG. 13A is a top view of a pre-molded leadframe for a cavity semiconductor package, such as for a MEMS microphone.
Figure 13B:
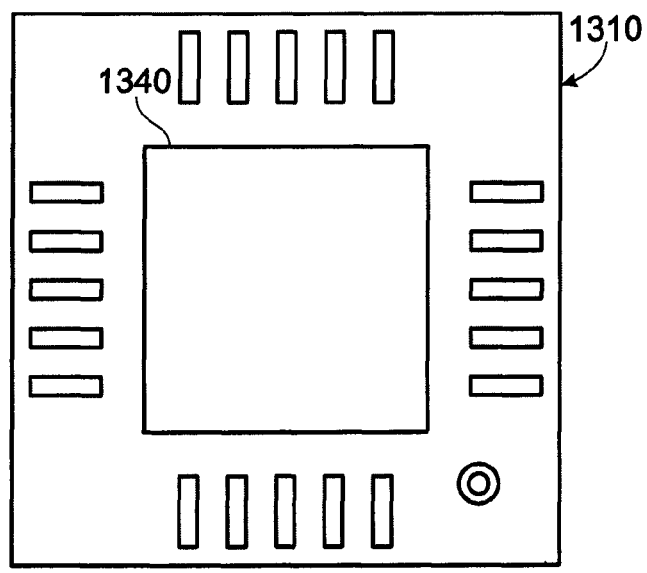
FIG. 13B is a bottom view of the pre-molded leadframe of FIG. 13A.
Figure 13C:
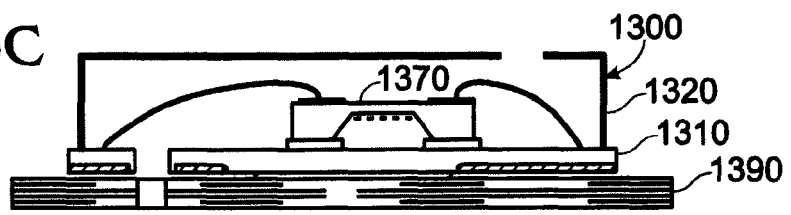
FIG. 13C is a side view of a MEMS microphone package including the pre-molded leadframe of FIG. 13A after package assembly with lid attached, taken along a cross section 13C-13C of the pre-molded leadframe.
Figure 14A:
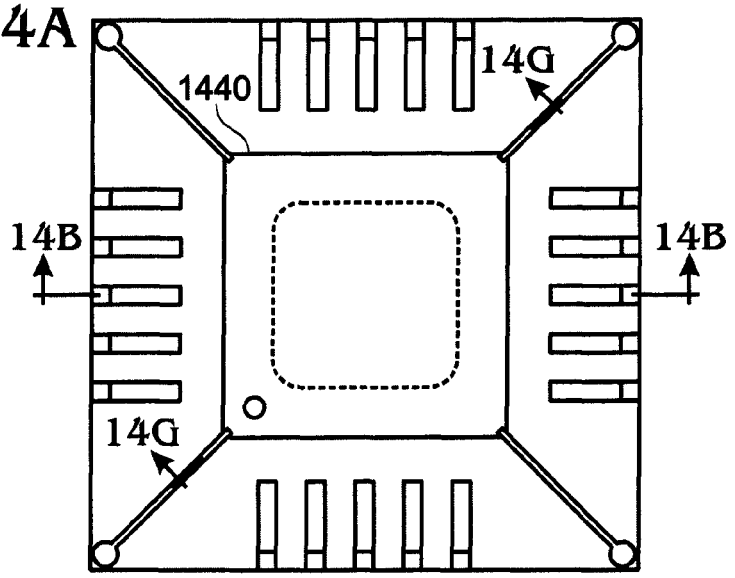
FIG. 14A is a top view of a pre-molded leadframe for a cavity semiconductor package, such as for a MEMS microphone.
Figure 14B:
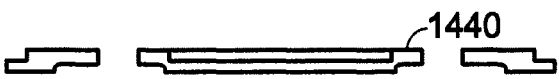
FIG. 14B is a side view taken along a cross-section 14B-14B of the pre-molded leadframe of FIG. 14A before pre-molding.
Figure 14C:
FIG. 14C is a side view also taken along the cross-section 14B-14B of the pre-molded leadframe of FIG. 14A after pre-molding.

A sixth embodiment of a pre-molded leadframe package 1300 shown in FIGS. 13A-13C has a hole 1348 for the acoustic port formed in the outer frame of the pre-molded leadframe 1310, rather than in the die pad 1340 as in the previously depicted embodiments. The acoustic cavity of this package also is defined by a pre-molded leadframe 1310 in conjunction with a conductive lid 1320. A second acoustic port 1322 is provided on top of the package in the conductive lid 1320. The two acoustic ports (one port on the package bottom side and the second port in the lid) may be required for sound transmission to the diaphragm for a top-side diaphragm type MEMS microphone die 1370, such as the type-B MEMS microphone die depicted in FIG. 2.

Figure 1:
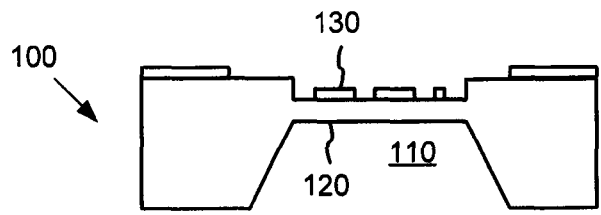
FIG. 1 is a cross-sectional side view of a MEMS silicon microphone die with a bottom side diaphragm.
Figure 2:
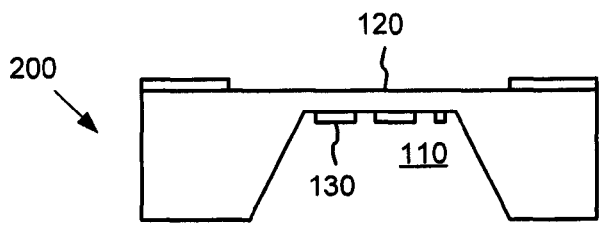
FIG. 2 is a cross-sectional side view of a MEMS silicon microphone die with a top side diaphragm.
Figure 3:
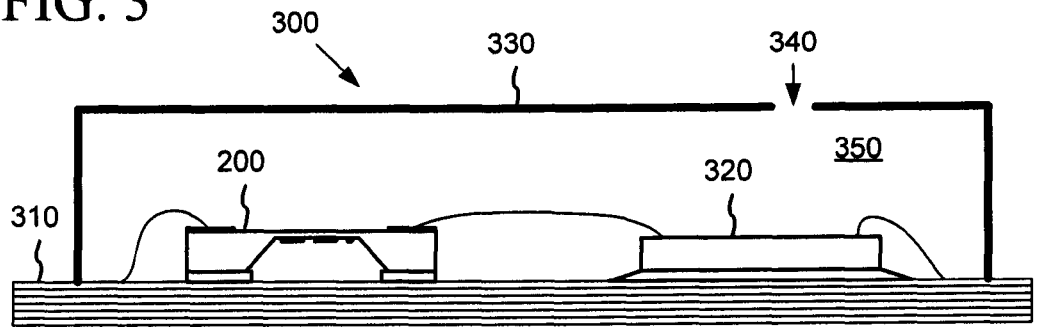
FIG. 3 is a cross-sectional side view of a plastic package with a laminate substrate for a MEMS silicon microphone die.
Figure 4:
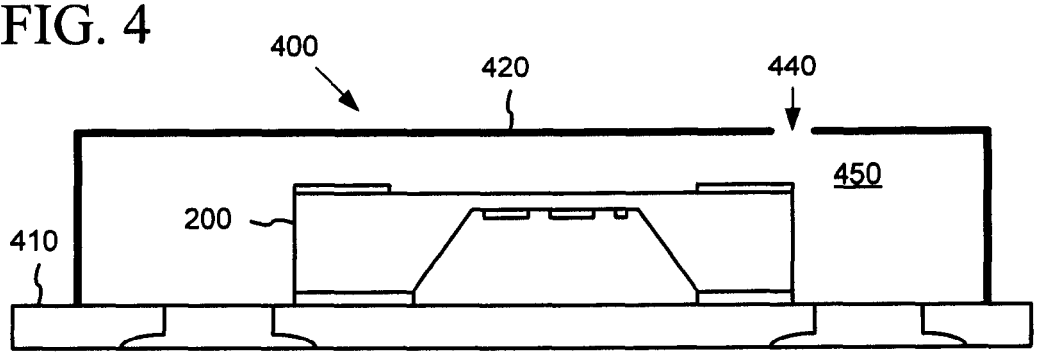
FIG. 4 is a cross-sectional side view of a plastic package with a premolded leadframe for a MEMS silicon microphone die.
Figure 5:
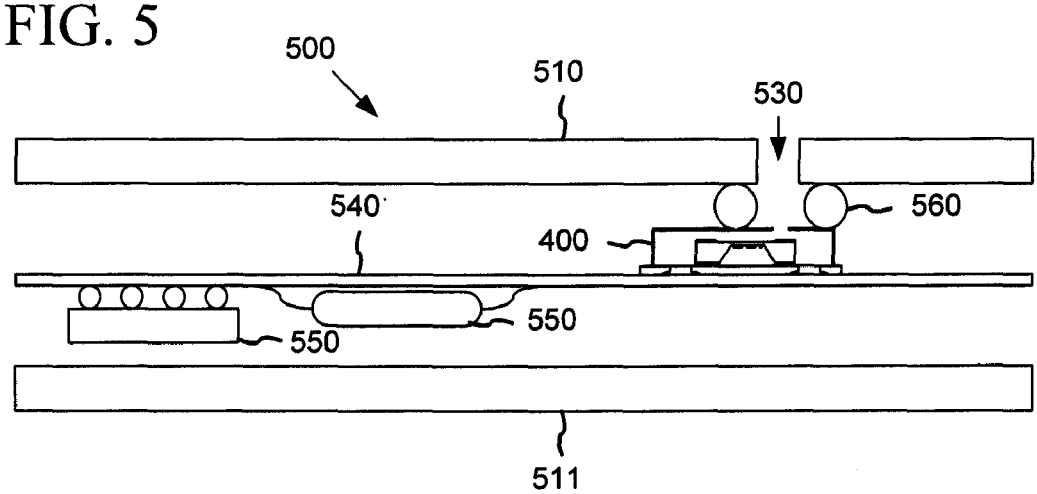
FIG. 5 is a cross-sectional side view of a portion of a cell phone case according to a first design that includes the MEMS microphone package of FIG. 4.
Figure 6:
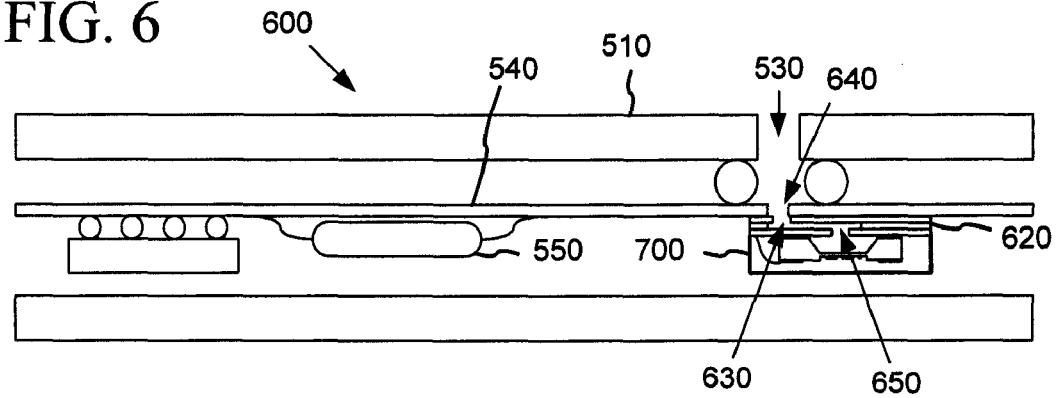
FIG. 6 is a cross-sectional side view of a portion of a cell phone case according to a preferred design that includes the microphone package of FIG. 7.
Figure 7:
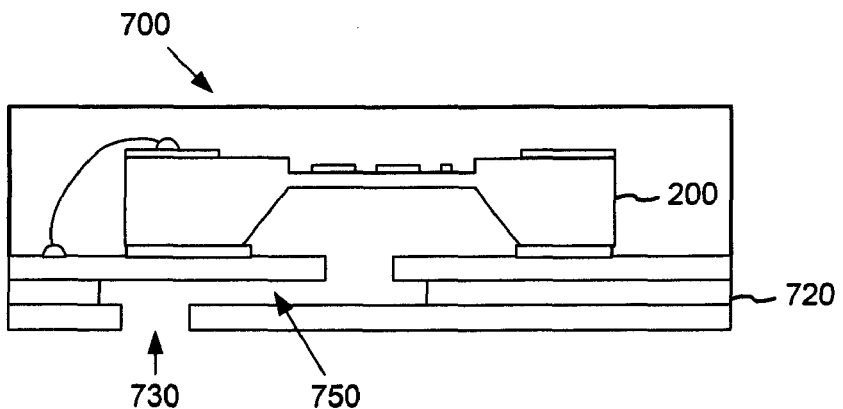
FIG. 7 is a cross-sectional side view of a MEMS microphone package with a laminated substrate and bottom-side acoustic port.

A seventh embodiment of a pre-molded leadframe package 1400 shown in FIGS. 14A-14G is designed to contain both a MEMS microphone die 1470 and an application specific integrated circuit (ASIC) die 1472 (typically a processor die). The package 1400 has a die pad 1440 with a recessed area 1442 in its center, which accommodates the two dies in a stacked configuration. The ASIC die 1472 mounts into the sunken area of the die pad 1440, and the MEMS microphone die 1470 mounts over the ASIC die 1472. The die pad 1440 also includes an off center hole 1448 to serve as the acoustic port into an acoustic cavity defined between a pre-molded leadframe 1410 and conductive lid 1420. This acoustic cavity configuration is for use with the MEMS microphone die of the type-B microphone die with top-side diaphragm that is depicted in FIG. 2.

As illustrated by the various embodiments just described, the pre-molded leadframe package described herein can be varied in detail. The package can contain a single die pad for a MEMS microphone die or other cavity semiconductor die. Alternatively, the pre-molded leadframe package can contain an ASIC or other die in addition to the MEMS microphone die. The dies can be accommodated on a single die pad, such as using the stacked configuration of the pre-molded leadframe package 1400 shown in FIGS. 14A-14G or other configuration. The package can also have a single die pad, large enough for both die. The package alternatively can have dual die pads, one with acoustic port and a cavity for MEMS die and the other for a processor die.

As also illustrated by the above-described embodiments, the acoustic cavity of the pre-molded leadframe package can be built into the package using half etch leadframe technology on the top or bottom side of the pre-molded leadframe (e.g., in the die pad), so as to be formed in conjunction with the printed circuit board (after board assembly) or with the MEMS microphone die and/or conductive lid of the package. The size and shape of the acoustic cavity can be designed for the best acoustic performance, e.g., to prevent resonance.

As also illustrated by the above-described embodiments, the acoustic port preferably is formed on the package's bottom side as part of the die pad of the package or other part of the pre-molded leadframe. For example, an area on the die pad can have an acoustic opening on the package bottom side, such as illustrated by the first through fifth embodiments discussed above. The die pad is then soldered to the cell phone's printed circuit board during board assembly. This can eliminate the need for a rubber gasket. With the pre-molded leadframe package soldered to the cell phone board, the die pad solder seals any air leaks.

Alternatively, the package can have a "dummy pad" area on the pre-molded leadframe that creates an acoustic opening soldered to the phone board, as in the sixth embodiment shown in FIGS. 13A-13C. The pad may be part of the die pad tie bar or a specially created pad, as well. Again, this dummy-pad area on the pre-molded leadframe of the package can be soldered to the printed circuit board at board assembly to seal against air leaks.

The pre-molded leadframe package optionally can include an area without preplating around the acoustic port. This helps in self alignment of the package with the printed circuit board, by preventing or helping avoid solder contamination inside the acoustic port when soldering the plated area of the die pad to the printed circuit board to form a peripheral seal around the acoustic port.

In some applications, the package can have an additional acoustic port on top of the package in the conductive lid, such as shown for the sixth embodiment in FIGS. 13a-c.

In view of the many possible embodiments to which the principles of our invention may be applied, we claim as our invention all such embodiments as may come within the scope and spirit of the following claims and equivalents thereto.

We claim:

1. A method of manufacturing a pre-molded leadframe for use in a cavity semiconductor package, the method comprising:

providing a die pad and a plurality of terminal lands; providing one or more tie bars extending between the die pad and an outer frame portion; molding a material about the die pad and the terminal lands to form a substrate having the outer frame portion, a top surface and a bottom surface; leaving portions of the die pad and terminal lands exposed to the top surface and the bottom surface; and providing an acoustic opening configured to permit through-air sound transmission through one or both of the molding material and the die pad, the acoustic opening extending between the top surface and the bottom surface.

2. The method of claim 1, further comprising providing a recessed region in one or both of the top surface and the bottom surface, the recessed region adjoining the acoustic opening.

3. The method of claim 1, wherein the acoustic opening is configured to permit through-air sound transmission to a semiconductor die being mounted to the die pad.

4. The method of claim 1, wherein the acoustic opening extends through the die pad.

5. The method of claim 1, wherein the acoustic opening extends through the outer frame portion.

6. The method of claim 1, wherein the acoustic opening is centrally located relative to the substrate.

7. The method of claim 1, wherein the acoustic opening is located off-center of the substrate.

8. The method of claim 1, further comprising plating an area of the bottom surface adjacent the acoustic opening with a metal for use in soldering the substrate to a printed circuit board, wherein said soldering is capable of forming an airtight seal between the substrate and the printed circuit board, and adjacent the acoustic opening and a corresponding hole in the printed circuit board being aligned therewith.

9. The method of claim 8, further comprising leaving an unplated area on the bottom surface immediately adjacent the acoustic opening for reducing or substantially eliminating solder contamination and obstruction of the acoustic opening when the substrate is soldered to the printed circuit board.

10. The method of claim 1, wherein the die pad has an inwardly hollowed surface adjoining the acoustic opening for defining a portion of an acoustic cavity.

11. The method of claim 10, wherein the inwardly hollowed surface is recessed from the top surface for defining an acoustic cavity between the substrate and a semiconductor die mounted thereto.

12. The method of claim 10, wherein the inwardly hollowed surface is recessed from the bottom surface for defining an acoustic cavity between the substrate and a printed circuit board to which the substrate is soldered.

13. The method of claim 1, further comprising: coupling a conductive lid to the substrate for enclosing a semiconductor die mounted thereto.

14. The method of claim 13, wherein the conductive lid defines a second acoustic opening for through-air transmission of acoustic energy.

15. A method of manufacturing a pre-molded leadframe substrate, the method comprising: positioning a die pad and a plurality of terminal lands in a substantially common plane within a mold so as to define one or more interstitial volumes among the die pad and terminal lands; flowing a material into at least one of the one or more interstitial volumes, wherein the material, die pad and terminal lands define a substantially planar substrate having a top surface and a bottom surface; and forming an acoustic opening extending between the top surface and the bottom surface for through-air transmission of sound through one or both of the mold and die pad, wherein, subsequent to the act of flowing the material, at least a portion of the die pad and a portion of one or more of the terminal lands are exposed to one or both of the top surface and the bottom surface and free of the material.

16. The method of claim 15, wherein the act of positioning a die pad comprises positioning a plurality of die pads.

17. The method of claim 16, wherein the act of flowing the material into at least one of the one or more interstitial volumes comprises flowing the material into a plurality of interstitial volumes, each of the interstitial volumes corresponding to a respective die pad, thereby forming a panel of pre-molded lead frame substrates.

18. A method of assembling a cavity semiconductor package, the method comprising: providing a pre-molded leadframe substrate comprising a top surface and a bottom surface, a die pad and a plurality of exposed terminal lands arranged in a substantially common plane between the top surface and the bottom surface, and a molding material, wherein the pre-molded leadframe substrate defines an acoustic opening for through-air transmission of acoustic energy through one or both of the molding material and die pad, the acoustic opening extending between the top surface and the bottom surface; coupling a semiconductor die being responsive to through-air transmission of acoustic energy to the pre-molded leadframe substrate, wherein said act of coupling comprises positioning the semiconductor die so as to receive at least a portion of any through-air transmission of acoustic energy passing through the acoustic opening.

19. The method of claim 18, further comprising coupling a lid to the leadframe substrate.

* * * * *